United States Patent [19]

Niitsu et al.

[11] Patent Number: 4,740,827
[45] Date of Patent: Apr. 26, 1988

[54] CMOS SEMICONDUCTOR DEVICE

[75] Inventors: Youichiro Niitsu; Shinji Taguchi; Kenji Shibata, all of Yokohama; Kouichi Kanzaki, Kawasaki, all of Japan

[73] Assignee: Kabushiki Kaisha Toshiba, Kanagawa, Japan

[21] Appl. No.: 913,383

[22] Filed: Sep. 30, 1986

[30] Foreign Application Priority Data

Sep. 30, 1985 [JP] Japan ................. 60-217128
Sep. 30, 1985 [JP] Japan ................. 60-217129
Mar. 31, 1986 [JP] Japan ................. 61-71141

[51] Int. Cl.[4] ............. H01L 29/78; H01L 27/02; H01L 29/06; H01L 27/12
[52] U.S. Cl. .................. 357/42; 357/49; 357/55; 357/50; 357/23.11
[58] Field of Search .......... 357/23.11, 50, 49, 55, 357/42

[56] References Cited

U.S. PATENT DOCUMENTS

| 4,135,954 | 1/1979 | Chang et al. | 357/23.11 |
| 4,231,057 | 10/1980 | Momma et al. | 357/55 |
| 4,477,310 | 10/1984 | Park et al. | 357/23.11 |
| 4,578,128 | 3/1986 | Mundt et al. | 357/50 |
| 4,613,885 | 9/1986 | Haken | 357/23.11 |
| 4,647,957 | 3/1987 | Coquin et al. | 357/23.11 |

OTHER PUBLICATIONS

R. D. Rung et al., "Deep Trench Isolated CMOS Devices", IEEE International Electron Devices Meeting, pp. 237–240, (Dec. 1982).

Y. Niitsu et al., "Latchup-Free CMOS Structure Using Shallow Trench Isolation", IEEE International Electron Devices Meeting, pp. 509–512, (Nov. 30, 1985).

Primary Examiner—Martin H. Edlow
Assistant Examiner—D. Featherstone
Attorney, Agent, or Firm—Foley & Lardner, Schwartz, Jeffery, Schwaab, Mack, Blumenthal & Evans

[57] ABSTRACT

In the CMOS semiconductor device having an epitaxial layer, a trench with an appropriate depth is formed in the vicinity of a boundary between a range in which a MOS transistor is formed and a well range in which another MOS transistor is formed; the inner wall surface of the trench is covered with a thermal oxide film; and the trench is buried with a semiconductor substance, so that two CMOS transistors can be electrically isolated by the trench to increase the latch-up holding voltage beyond a supply voltage (e.g. 5 v). Therefore, the latch-up proof resistance can be increased to protect the device from noise which otherwise would break the device. Further, the trench depth is shallower than the low impurity atom concentration layer (epitaxial layer) or 3 $\mu$m but deeper than a value obtained by subtracting 2 $\mu$m from the above thickness or 3 $\mu$m.

13 Claims, 16 Drawing Sheets

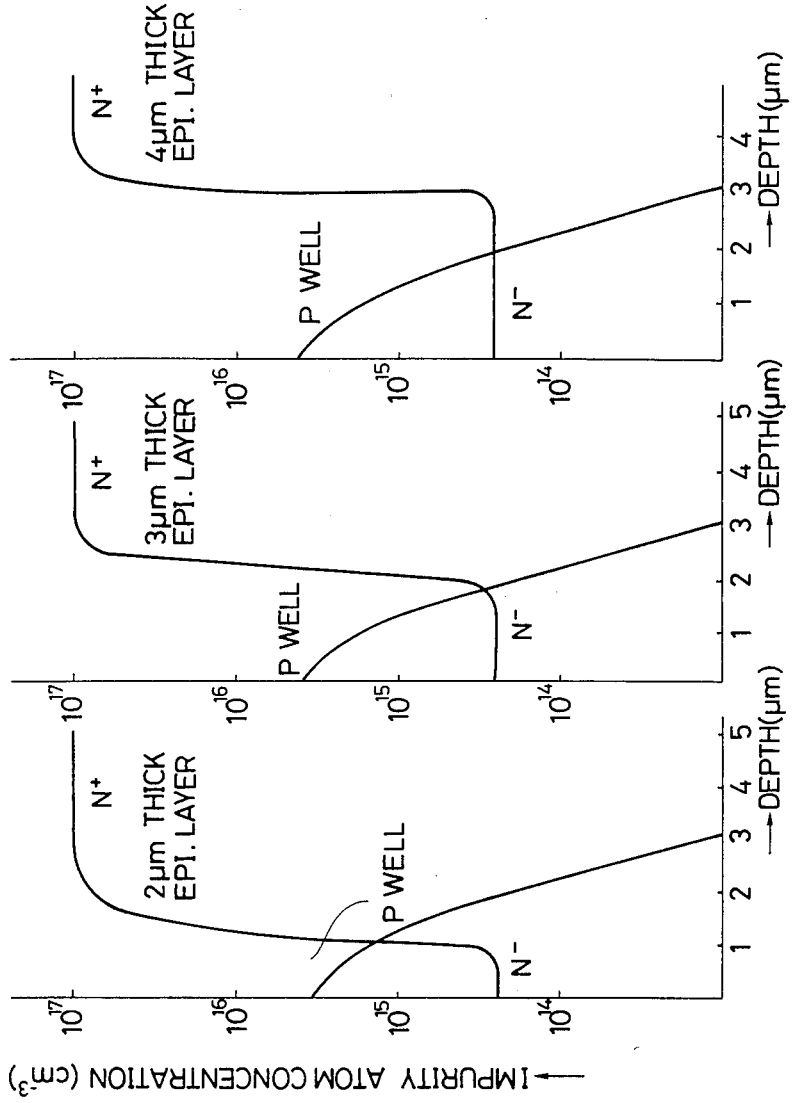

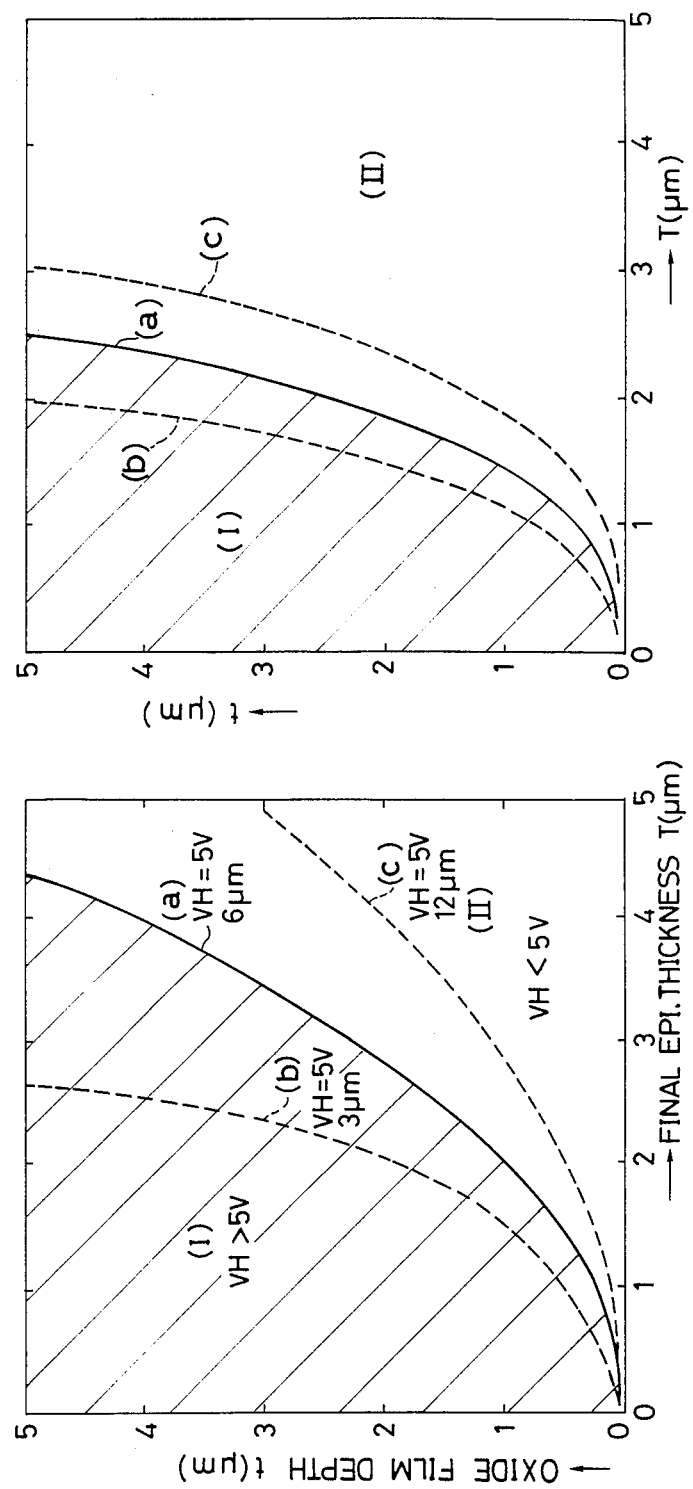

CMOS SEMICONDUCTOR DEVICE

BACKGROUND OF THE INVENTION

1. Field of the Invention

The present invention relates generally to a CMOS semiconductor device and to a method of manufacturing the same, and more specifically to a CMOS semiconductor device which can effectively prevent the occurrence of latch-up phenomenon due to bipolar transistors parasitically formed when N- and P-channel MOS transistors are formed in a bulk substrate.

2. Description of the Prior Art

Recently, power consumption of a chip shows a tendency to increase with increasing integration rate of an integrated circuit. To reduce power consumption, an integrated circuit is usually formed by using CMOS circuits having low power consumption. However, in ordinary CMOS circuits having no SOI structure, there inevitably exists a PNPN junction in structure, so that parasitic thyristors are formed. Therefore, in cases where an excessive voltage due to power supply noise is applied to the input terminal of the parasitic thyristors, the thyristors are turned on and therefore an excessive current is kept passing through the device, resulting in element destruction. This phenomenon is called "latch-up".

To prevent the above-mentioned latch-up phenomenon, there have been proposed various CMOS semiconductor devices. For example, a CMOS semiconductor device has been proposed in which substrate contacts or well contacts termed a guard ring are formed so as to surround MOS transistors which configure a CMOS circuit. However, current which generates the latch-up phenomenon decreases with increasing integration rate and therefore with decreasing space between circuit elements in the CMOS semiconductor device, thus resulting in a problem in that the effect upon the prevention of the latch-up phenomenon is reduced. In addition, since some area where a guard ring is formed should be prepared when arranging circuit elements, it is difficult to realize a high integration rate.

Further, there has been proposed a CMOS semiconductor device which prevents latch-up phenomenon by using a so-called expitaxial substrate with a low parasitic resistance. In this case, the semiconductor substrate is formed with two layers in such a way that the impurity atom concentration of the surface of the semiconductor substrate on which circuit elements are formed is the same as is conventional device, but that under the substrate surface layer the atom impurity concentraction is higher than in conventional devices.

FIG. 1A shows the relationship between the holding current and voltage required to hold the latch-up phenomenon and the distance between P-channel transistor drain range and N-channel transistor drain range. The two P- and N-channel transistor drain ranges are formed in the vicinity of each other so as to form a CMOS circuit on a P-type epitaxial substrate with impurity atom concentrations of about $1 \times 10^{18}$ cm$^{-3}$ under the semiconductor substrate and about $2 \times 10^{15}$ cm$^{-3}$ in the surface layer (of about 10 $\mu$m thickness). FIG. 1A clearly indicates that where an epitaxial substrate is used, both the holding current and voltage increase, so that the resistance against the latch-up phenomenon can be improved. However, the holding current and voltage are not yet sufficient in order to securely prevent the latch-up phenomenon.

Further, there has been proposed another CMOS semiconductor device for preventing the latch-up phenomenon such that a trench is provided between a well range in which one MOS transistor is formed and an epitaxial substrate in which the other MOS transistor is formed in order to electrically isolate these two ranges, that is, reduce current which turns on the parasitic thyristor.

The trench formed in the CMOS semiconductor device as described above is fairly deep to such an extent as 5 to 6 $\mu$m. Further, the trench is formed near the boundary between P channel MOS transistor range and N channel MOS transistor range and then isolated electrically, in accordance with the following processes as shown in FIGS. 2(a) to 2(d):

A trench 101 with a depth of about 5 to 6 $\mu$m and a width of 1.0 to 1.2 $\mu$m is formed starting from an epitaxial layer 107 of low impurity atom concentration layer to a substrate 109 of high impurity atom concentration layer as shown in FIG. 2A-(a). A thin oxide film 103 is formed on the inner wall surface of the formed trench 101 as shown in FIG. 2A-(b). Thereafter, a semiconductor substance such as, for instance, silicon having a thermal expansion coefficient equivalent to that of the substrate 109 is buried within the trench 101 so as not to produce a strain in the trench 101 due to a difference in thermal expansion coefficient between the two as shown in FIG. 2A-(c). Finally, an oxide film 105 is formed on the upper surface of the trench 101 by heat treatment for electrical isolation as shown in FIG. 2A-(d).

In the prior-art process as described above, however, since the impurity atom concentration is different between the epitaxial layer 107 and the substrate 109 in the process (a), a stepped portion 113 is formed within the trench 101 due to a difference in etching speed between the two. Therefore, in the process (c) at which the tranch 101 is buried, the trench 101 is not completely buried and therefore a cavity 111 is readily produced within the trench 101. In addition, in case where a cavity 111 appears, since heat treatment for forming an oxide film 105 on the upper portion of the trench 101 is affected in the process (d), the semiconductor substance on the inner wall surface of the cavity 111 is oxidized, so that a change in volume occurs near the cavity 111 and thereby defects appear at or near the stepped portion 113.

On the other hand, it takes a long etching treatment time in order to form a relatively deep trench 101 (e.g. 5 to 6 $\mu$m) in the epitaxial layer 107. Therefore, cores 112 which cause crystal defects are readily produced near the surface of the epitaxial layer 107 at which the trench 101 is formed as shown in FIG. 2B-(a). Further, in the process (d), since another heat treatment is effected to form an oxide film 105 on the upper surface of the semiconductor substance 106 buried in the trench 101, crystal defects 113 appear near the surface of the epitaxial layer 107 and around the periphery of the trench 101.

Therefore, in the case where the trench 101 is so formed as to extend from the low atom concentration layer to the high atom concentration layer to such an extent of 5 to 6 $\mu$m, various deteriorations in element characteristics arise such as an increase in leakage current, a decrease in withstand voltage, a generation of interface potential level, etc., thus resulting in a problem such that production yield is lowered, as depicted in FIG. 1B.

On the other hand, as a method of suppressing the occurrence of latching phenomenon, there exists a method of forming a dielectric substance between the two complementary MOS transistars. In more detail, a trench with a width of about 1 μm is formed in a substrate by RIE (reactive ion etching) technique; a 250 to 1000 Å thick oxidized film is formed on the surface thereof; polycrystal silicon is buried in the trench; the polycrystal silicon is etched back by anisotropic etching method to leave the polycrystal silicon only within the trench, in order that a dielectric substance is formed between the two MOS transistors.

However, the following problems are involved in the above method: The first drawback is that the etching back technique of the trench burying material (polycrystal silicon) is not suitable for mass production processes. That is, since the buried material is thick (the film thickness almost the same as the trench width is required), the film thickness disperses and the loading effect is great in etch back process; as a result, undesired burying materials often remain disadvantageously at the periphery of the wafer.

In addition, the ordinary LOCOS (localized oxidation of silicon) cannot be adopted sometimes in the element separation process. That is, in the case where polycrystal silicon is used as the trench burying material, the polycrystal silicon is strongly oxidized by the LOCOS, so that many defects appear in the oxidized film. Further, in the case where the burying material is a CVD (chemical vapor deposition) silicon oxidized film, a stress is applied to the vertical wall surface of the trench due to the difference in thermal expansion coefficient between the two, thus causing defects.

SUMMARY OF THE INVENTION

With these problems in mind, therefore, it is the primary object of the present invention is to provide a CMOS semiconductor device which can improve the resistance against latch-up due to noise without deteriorating circuit element characteristics and the method of manufacturing the same.

To achieve the above-mentioned object, the CMOS semiconductor device according to the present invention comprises (a) a first conductive-type semiconductor substrate of two, high and low impurity atom concentration, layers; (b) a second conductive-type MOS transistor formed at a part of the low impurity atom concentration layer; (c) a second conductive-type well range formed at a part of the semiconductor substrate; (d) a first conductive-type MOS transistor formed within the second conductive-type well range; and (e) a trench formed in the vicinity of a boundary between the range in which the second conductive-type MOS transistor is formed and the second conductive-type well range, a depth of the trench being shallower than a thickness of the low impurity atom concentration layer but deeper than a value obtained by subtracting 2 μm from the thickness of the low impurity atom concentration layer, an inner wall surface of said trench being formed with an oxide film, and the trench being buried with semiconductor substance. Further, the depth of the trench is preferably shallower than 3 μm.

To achieve the above-mentioned object, the method of manufacturing the complementary semiconductor device according to the present invention comprises the following steps of: (a) forming a trench having a tapered in cross section in the surface of the substrate at such a position as to isolate a current path due to bipolar transistors parasitically formed at least between a diffusion layer of the first conductive-type MOS transistor and that of the second conductive-type MOS transistor; and (b) forming a thermal oxidation film on the surface of the substrate, at least including an inner surface of the trench.

In the CMOS semiconductor device according to the present invention, a trench having an appropriate depth is formed in the vicinity of a boundary between a range in which a second conductive-type MOS transistor is formed and a second conductive-type well range; the inner wall surface of the trench is formed with an oxide film; and the trench is buried with a semiconductor substance, so that two complementary MOS transistors are electrically separated from each other by the trench in order to increase the latch-up holding voltage beyond a supply voltage (e.g. 5 V). Therefore, the CMOS circuit is protected against noise by improving the latch-up proof resistance. Further, the appropriate depth of the trench is shallower than the thickness of the low impurity atom concentration layer (epitaxial layer) or 3 μm but deeper than a value obtained by subtracting 2 μm from the above thickness or 3 μm.

BRIEF DESCRIPTION OF THE DRAWINGS

The features and advantages of the CMOS semiconductor device and the method of manufacturing the same according to the present invention will be more clearly appreciated from a following description taken in conjunction with the accompanying drawings in which like reference numerals designate the same or similar elements or sections throughout the figures thereof and in which:

FIG. 3 is a graphical representation showing the relationship between trench depth and production yield;

FIGS. 3 (A) to (C) are graphical representation showing the relationship between the trench depth and impurity profiles in the epitaxial layer and the well range of the CMOS device related to the first embodiment of the present invention;

FIGS. 8-1 to FIG. 8-14 are cross-sectional views for assistance in explaining the manufacturing processes of the first embodiment of the present invention;

FIG. 9 is a cross-sectional view for assistance in explaining the manufacturing process of the third embodiment of the present invention;

FIG. 10 is a cross-sectional view for assistance in explaining the manufacturing process of the fourth embodiment of the present invention;

FIGS. 11-1 to 11-4 are cross-sectional views for assistance in explaining the manufacturing process of the fifth embodiment of the present invention;

FIGS. 12 (A) and 12 (B) are graphical representations showing the relationship between the epitaxial layer thickness and the oxide film thickness with the holding voltage as a parameter;

FIGS. 13 (A) and 13 (B) are cross-sectional views for assistance in explaining the present invention;

FIGS. 14 and 15 are graphial representations for assistance in explaining the present invention;

DETAILED DESCRIPTION OF THE PREFERRED EMBODIMENTS

The embodiments of the present invention will be described with reference to the attached drawings.

Figures 1, 8:
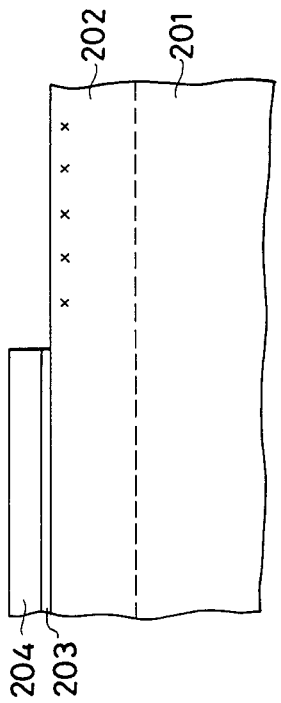
Figures 2, 8:
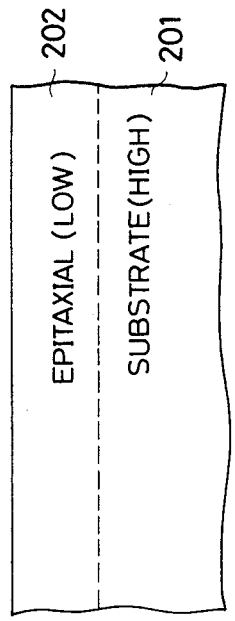
Figures 3, 8:
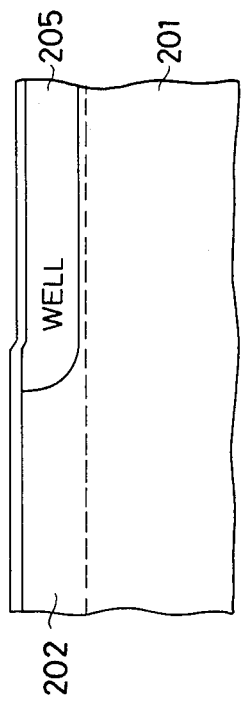
Figures 4, 8:
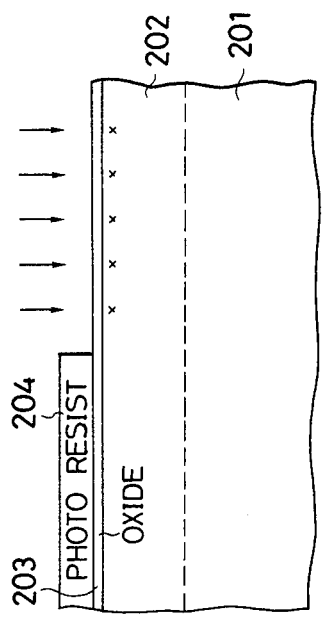

FIGS. 3 (A), (B) and (C) show the impurity atom concentration distribution profiles with respect to the depth of the epitaxial substrate formed on to surface of the semiconductor substrate on which a CMOS semiconductor device related to a first embodiment of the present invention is arranged. In this epitaxial substrate, an epitaxial layer is grown by doping phosphorus at a low concentration rate (e.g. about $2.5 \times 10^{15} cm^{-3}$) into an N type semiconductor substrate obtained by doping antimony at a high concentration rate (e.g. about $1 \times 10^{18} cm^{-3}$); and a P type well range (referred to as P well hereinafter) is formed by ion implantation of boron. Further, FIGS. 3 (A), (B) and (C) show three examples where the thicknesses of the epitaxial layer are 2, 3 and 4 $\mu m$, respectively. FIG. 3(A) indicates that where the thickness of the epitaxial layer is as thin as 2 $\mu m$, the depth of the P well junction is about 1.25 $\mu m$ because impurity atom of antimony in the semiconductor substrate under the epitaxial layer seeps toward the epitaxial layer. On the other hand, where the thickness of the epitaxial layer is 4 $\mu m$, a low impurity atom concentration layer of about 1 $\mu m$ exists at the bottom of the P well, as shown in FIG. 3 (C).

Figure 1B:
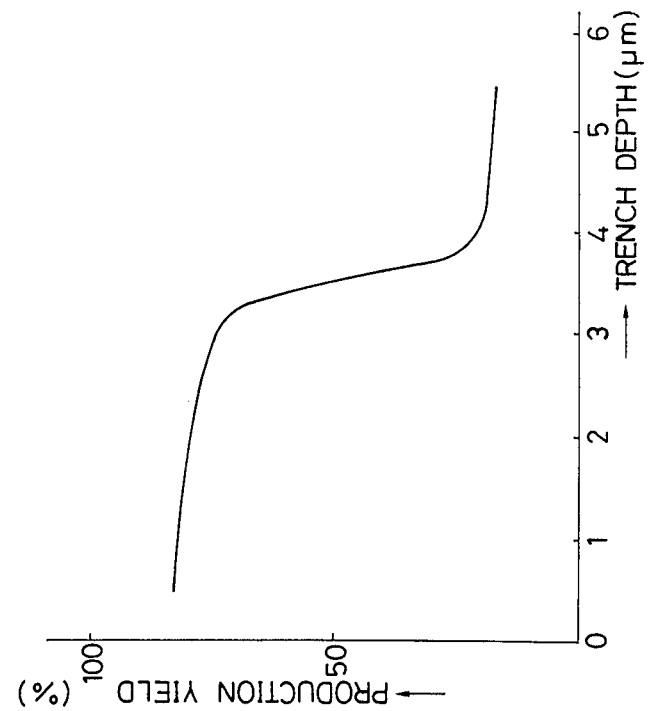
FIG. 1 is a graphical representation showing the relationship between the latch-up holding voltage and current and the distance between two transistor drains for comparison of the epitaxial substrate with the non-epitaxial substrate.
Figure 1A:
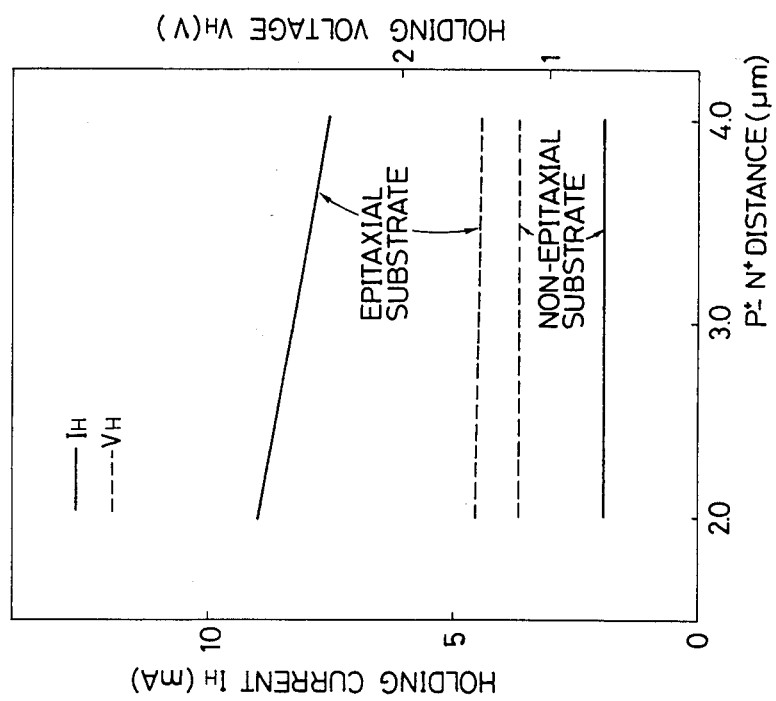
Figure 2A:
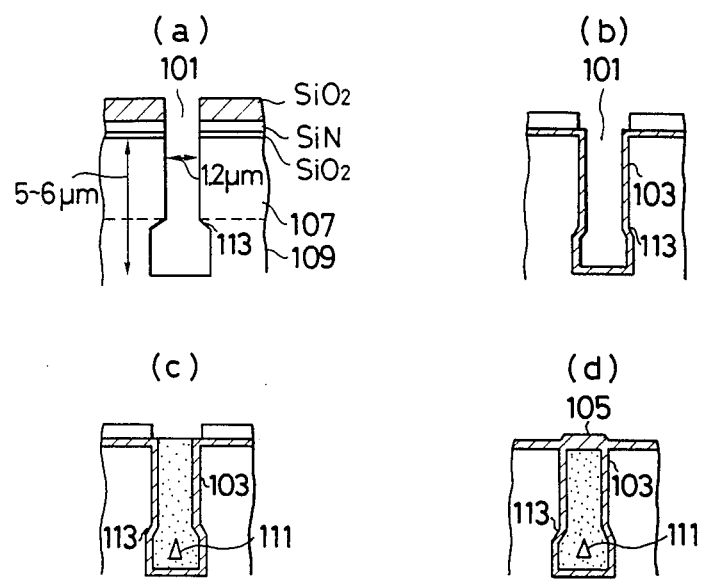
FIG. 2A shows the process of forming a trench for assistance in explaining a problem thereof.
Figure 2B:
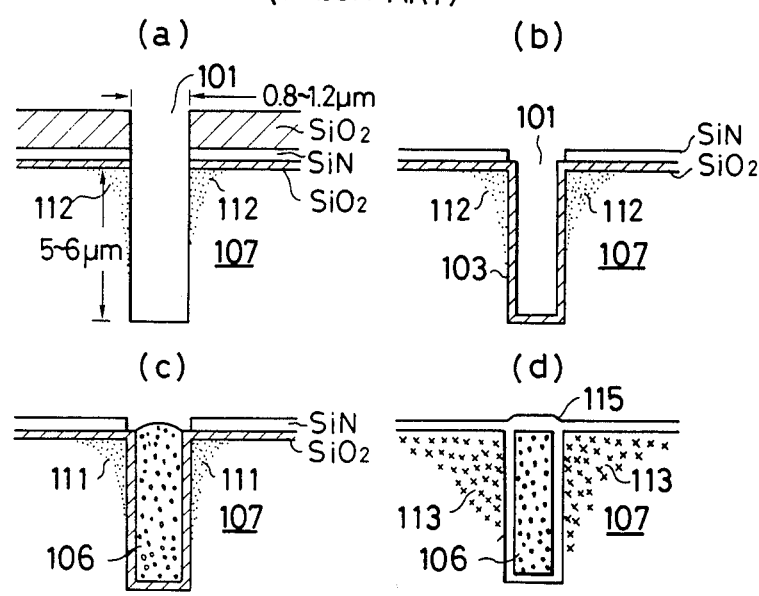
FIG. 2B shows the same process for assistance in explaining another problem thereof.
Figure 4:
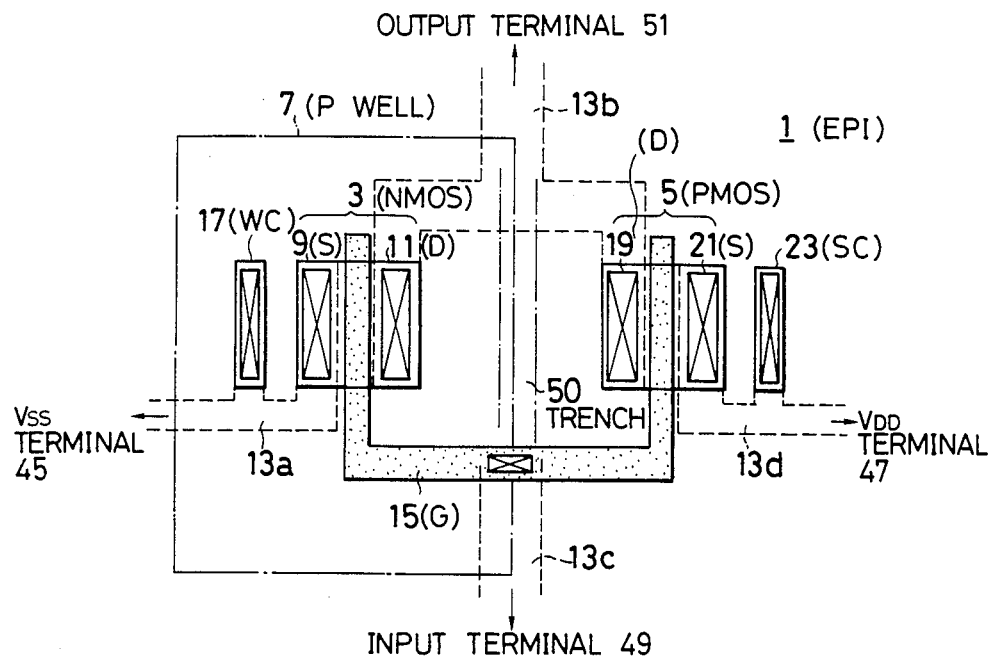
FIG. 4 is a plan view showing a pattern of the CMOS semiconductor device shown in FIG. 3.

FIG. 4 is a pattern plan view, which shows a CMOS semiconductor device configuration formed on three different epitaxial substrates having different thicknesses as shown in FIGS. 3 (A) to (C). In the drawing, an N channel MOS transistor 3 (referred to as NMOS transistor) and a P channel MOS transistor 5 (referred to as PMOS transistor) are formed on an N type epitaxial substrate 1 so as to constraut a CMOS inverter circuit. A P type well 7 (referred to as P well) is formed in the epitaxial substrate 1, and further a pair of N-type ranges 9 and 11 are formed a predetermined distance spaced from each other within this P well 7 so as to construct a source and a drain of the NMOS transistor 3. Hereinafter, the numeral 9 denotes an NMOS source range; and 11 denotes an NMOS drain range. The NMOS source range 9 is connected to a $V_{SS}$ terminal 45 via a first aluminium wire 13a and the NMOS drain range 11 is connected to an output terminal 51 via a second aluminium wire 13b. A gate electrode 15 common with the gate of a PMOS transistor 5 (described later) is formed on the surface of the epitaxial substrate 1 between the NMOS source range 9 and the NMOS drain range 11. This gate electrode 15 is connected to an input terminal 49 via a third aluminium wire 13c. Further, a well contact 17 is arranged within the P well 7, and this well contact 17 is connected to the $V_{SS}$ terminal 45 via the aluminium wire 13a.

On the epitaxial substrate 1, a pair of P type ranges 19 and 21 are formed a predetermined distance away from each other so as to construct a drain and a source of the PMOS transistor 5. Hereinafter, 19 denotes a PMOS drain range; and 21 denotes a PMOS source range. The PMOS drain range 19 is connected to the output terminal 51 via the aluminium wire 13b, and the NMOS source range 21 is connected to the $V_{DD}$ terminal 47 via a fourth aluminium wire 13d. The gate electrode 15 is formed on the surface of the epitaxial sibstrate 1 between the PMOS drain range 19 and the PMOS source range 21. This gate electrode 15 is connected to the input terminal 49 via the aluminium wire 13c. Further, a substrate contact 23 is formed in the epitaxial substrate 1, and this substrate contact 23 and the $V_{DD}$ terminal are connected by the aluminium wire 13d. Further, a trench 50 is formed in the vicinity of the boundary between the P well 7 and the P channel MOS transistor 5, as shown in FIG. 4.

Figure 5:
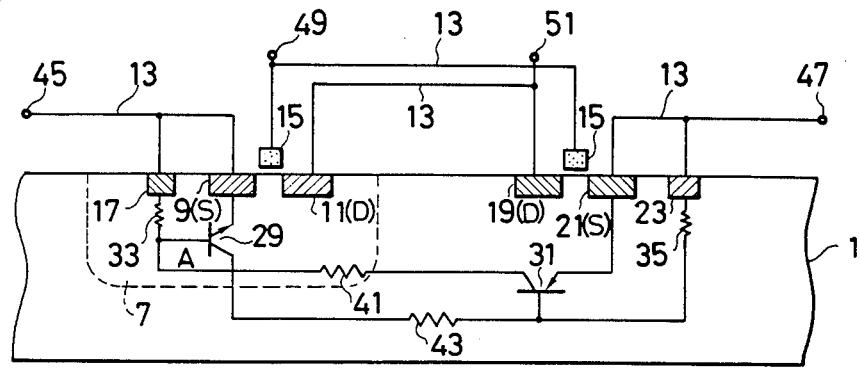
FIG. 5 is a cross-sectional view of FIG. 4.
Figure 6:
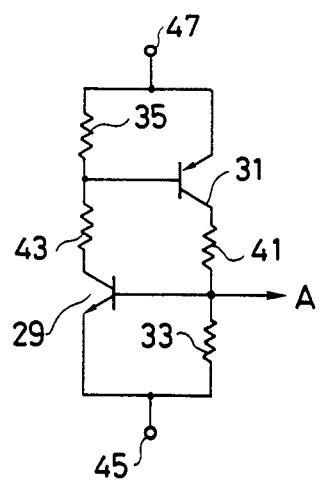
FIG. 6 is an equivalent circuit diagram of a parasitic thyristor formed in the device shown in FIG. 5.
Figure 7A:
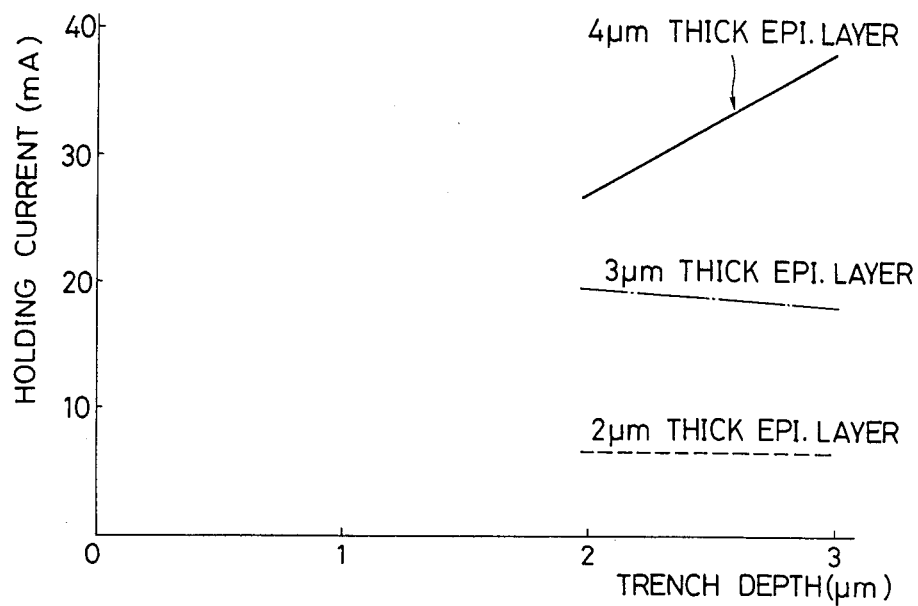
FIGS. 7 (A) and (B) show the relationship between the holding voltage/current and the trench depth with the epitaxial layer thickness with a parameter.
Figure 7B:
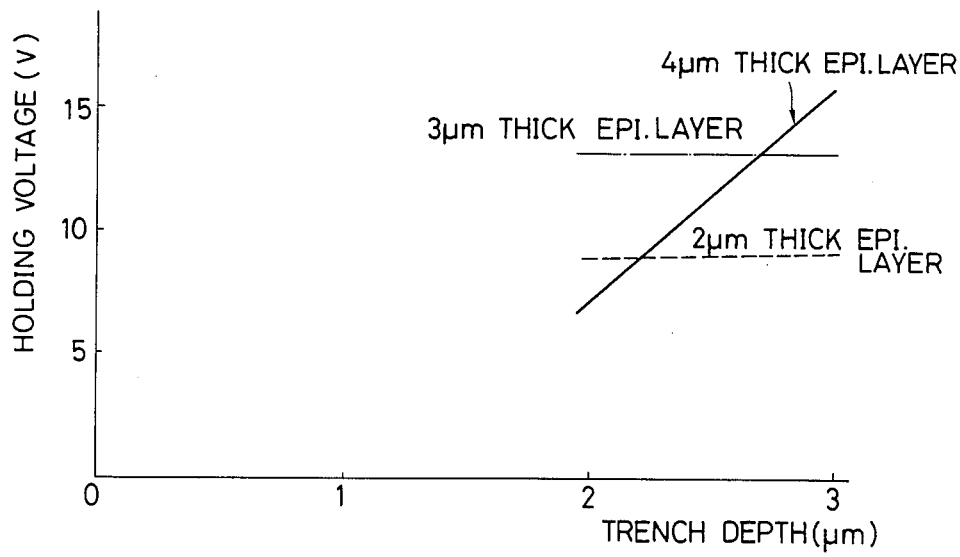

FIG. 5 shows a cross-sectional view of FIG. 4, in which a parasitic thyristor configured by parasitic transistors and parasitic resistor both existing in the CMOS structure is shown in an approximate equivalent circuit fashion. further, FIG. 6 shows only this equivalent circuit extracted from FIG. 5. In FIG. 5, the numeral 29 denotes a vertical parasitic NPN bipoler transistor (referred to as NPN transistor) formed with the NMOS source range 9 as emitter, the P well 7 formed in the epitaxial substrate 1 as base and the N type substrate 1 as collector. Further, the numeral 31 denotes a horizontal parasitic PNP bipolar transistor (referred to as PNP transistor) formed with the PMOS source range 21 as emitter, the N type epitaxial substrate 1 as base, and an P well 7 formed in the epitaxial substrate 1 as collector. The emitter of the PNP transistor 29 is connected to the $V_{SS}$ terminal 45; the base of the NPN transistor 29 is connected to the $V_{SS}$ terminal 45 via a parasitic well resistance 33 and additionally to the collector of the PNP transistor 31 via a collector parasitic resistance 41 of the PNP transistor 31. Further, the collector of the NPN transistor 29 is connected to the base of the PNP transistor 31 via a collector parasitic resistor 43 of the NPN transistor 29, and the base of the transistor 31 is connected to the $V_{DD}$ terminal 47 via a parallel-connected parasitic substrate resistor 35. The emitter of the PNP transistor 31 is connected to the $V_{DD}$ terminal 47.

Figures 7, 8:
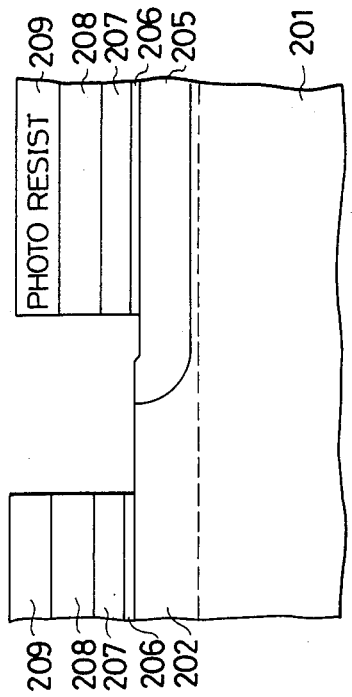
Figure 8:
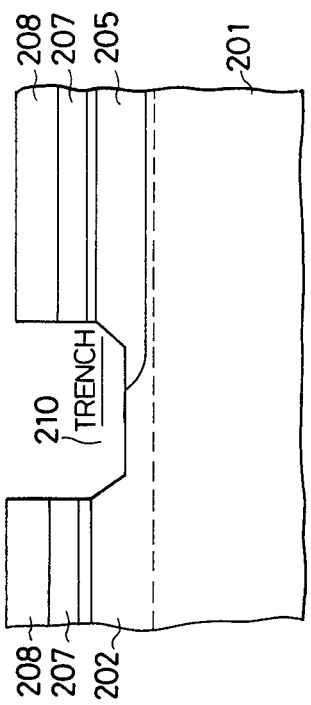
Figures 5, 8:
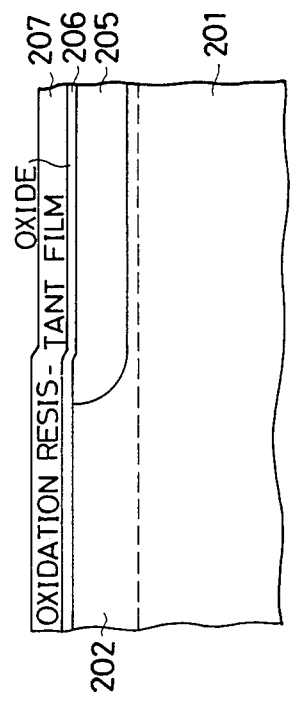
Figures 6, 8:
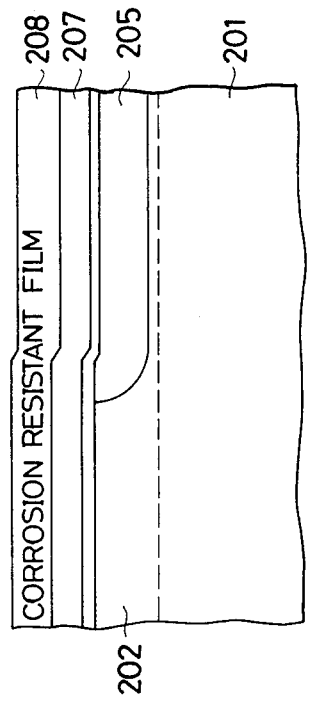

FIGS. 7 (A) and (B) show the measured results of holding current and voltage required to hold the latch-up phenomenon. This latch-up phenomenon is generated by the following conditions: The CMOS circuit shown in FIGS. 4 and 5 is formed on the epitaxial substrate 1 as explained with reference to FIG. 3; a trench filled with a semiconductor substrate (e.g. silicon) having substantially the same thermal expansion coefficient as that of the epitaxial substrate is formed near the boundary between the P well 7 at which to NMOS transistor 3 is formed and the range at which the PMOS transistor 5 is formed to electrically isolate the NMOS transistor 3 from the PMOS transistor 5; and a carrier is injected from the terminal A (see FIG. 5) to turn on the parasitic thyristor.

As shown in FIGS. 7 (A) and 7 (B), where the epitaxial layer is 2 or 3 μm in thickness, both the holding current and voltage are almost constant as long as the trench depth lies within a range from 2 to 3 μm, and further the holding voltage is higher than the supply voltage (5 V in usual). As shown in FIGS. 3 (A), (B) and (C), since the bottom of the 2 μm-deep trench reaches an high concentration epitaxial substrate, the parasitic resistor 41 shown by the equivalent circuit of FIG. 6 is sufficiently high, and therefore the holding voltage is independent from the trench depth.

On the other hand, in the case where the epitaxial layer is 4 μm in thickness, since low concentration impurities exist at the bottom of the P well 7 as shown in FIG. 3 (C), although the 2 μm deep trench bottom does not reach the high concentration epitaxial substrate, the holding voltage is higher than 5 V.

When the holding voltage exceeds the supply voltage (5 V in usual) of the CMOS circuit, even if the CMOS circuit changes to a latch-up state due to external noise, this latch-up state is not kept, so that the CMOS circuit will not be broken. Therefore, it is unnecessary that the trench bottom should reach the high concentration epitaxial substrate, but the trench depth should be so determined that the holding voltage exceeds 5 V.

Therefore, it is possible to determine the conditions that the trench allows the holding voltage to exceed 5 V with reference to FIG. 7 (B). That is, the conditions are: on epitaxial substrate is used; the resistance of the high impurity atom concentration layer of the epitaxial substrate is sufficiently low; a semiconductor substance is burried in the trench; and the trench depth is shallower than 3 μm or than the epitaxial layer (low impurity atom concentration layer) but deeper than a value obtained by subtracting 2 μm from the epitaxial layer thickness (epi. thickness of 2, 3 or 4 - 2 μm). Under the above conditions, since the parasitic resistance 41 of the parasitic thyristor is sufficiently high, it is possible to increase the holding voltage beyond 5 V, so that the latch-up proof resistance can be improved.

The method of manufacturing the CMOS semiconductor device according to the present invention will the described in further detail with reference to the attached drawings.

EMBODIMENT I

(Step 1-1)

First, an N (or P)type silicon semiconductor substrate 201 of high impurity atom concentration is prepared, and an N (or P) type epitaxial layer 202 of low impurity atom concentration is grown on the surface of the substrate 201 as shown in FIG. 8-1. The thickness of the epitaxial layer 202 should sufficiently be thin to such an extent that impurity atoms diffused from the high impurity atom concentration substrate 201 during the heat treatment process (effected later) do not exert a harmful influence upon the elements formed on the surface of the layer 202, because the thiner the epitaxial layer 202 is, the higher will be the latch-up proof resistance. For instance, when an N type substrate with antimony (0.01 to 0.02 ohm.cm) as dopant is used, it is desirable that the thickness of the epitaxial layer is a value obtained by adding 1 to 3 μm to the junction depth of the well range. On the other hand, where a P-type substrate is adopted, in the same way, the thickness is preferably a value obtained by adding 5 to 8 μm thereto. Although the appropriate thickness of the epitaxial layer differs according to the kind of heat treatment to be effected, it is necessary that the thickness of the epitaxial layer maintaining the original concentration after all the processes have been completed (referred to as the final epitaxial thickness) is almost the same as the junction depth of the well range. Therefore, the shallower the junction depth of the well range is, the higher will be the latch-up proof resistance. Further, when the N channel MOS transistor and the P channel MOS transistor are spaced as narrow as 6 μm or less with the well boundary sandwiched therebetween, the condition that the manufactured complementary semiconductor device is not subjected to the latch-up phenomenon (referred to as latch-up free) is that the junction depth of the well range on the final epitaxial thickness should be less than 2 μm. Further, where a P well range is formed on the substrate by heat diffusion at 1190° C, for instance, and an epitaxial layer with phosphorus as depant is grown on an N type substrate with antimory as depant, the epitaxial layer is 3.52 μm in thickness in order to obtain the P well range junction depth of 2 μm. The epitaxial layer thickness under other conditions can readily be determined by simulation.

(Step 1-2)

An oxide film 203 in formed on the surface of the epitaxial layer 202. Therefore, a predetermined range on the substrate surface is covered by a photo resist 204 in accordance with the ordinary photoetching process, and then P-type impurities (or N-type impurities) are ion-implanted as dopant for the well range by using this photo resist 204 as a mask, as shown in FIG. 8-2. Here, it is also possible to form a photo resist 204 without forming the oxide film 203 on the surface of the layer 202 in this process. In this connection, this oxide film 203 is formed to prevent impurities included in the photo resist 204 from being absorbed into the substrate, to prevent the substrate from crystal defects due to the substrate damage caused by ion implantation, to engrave a well pattern on the substrate after the oxide film on the ion implantation range has been removed by etching, or to improve the adhesiveness of the photo resist onto the substrate.

(Step 1-3)

The oxide film 203 is selectively removed by etching with the photo resist 204 as a mask according to the necessity as shown in FIG. 8-3. This step is required when a well pattern is engraved on the substrate and then another pattern should accurately be fit to this well pattern by the use of an aligner.

(Step 1-4)

The photo resist 204 is removed, and the P (or N) type impurities previously ion-implanted as dopant in the well range are thermal-diffused where necessary to form a P (or N) type well range 205 as shown in FIG. 8-4. In this connection, when high energy ions are implanted in the step 1-2so that impurities may reach a sufficiently deep position, it is possible to omit this thermal diffusion process.

(Step 1-5)

The substrate surface is covered by a film which will not cause crystal defects, for instance, such as an oxide film 206, and further the film 205 is covered by an oxidation-resistance film 207 as shown in FIG. 8-5. Further, there are some cases where the oxide film 206 is not newly formed when the well diffusion is effected within an oxidizing atmosphere. This oxide film 206 serves to prevent defects caused by stress developed between the film 207 and the substrate 201 when thermal expansion coefficient is fairly different between the two. Therefore, if the generation of the above stress is not expected, it is unnecessary to form this oxide film 206.

(Step 1-6)

The surface of the oxidation-resistance film 207 is covered by a corrosion resistant film 208 as shown in FIG. 8-6. As this corrosion resistant film 208, a substance having a high etching selection ratio should be used relative to the substance 201 and the epitaxial layer 202. For instance, SiN or $SiO_2$ is preferable. Further, if the oxidation-resistant film 207 has an anticorrosion property, it is unnecessary to form this 10 corrosion resistant film 208.

(Step 1-7)

The oxide film 206, the oxidation-resistant film 207, and the corrosion resistant film 208 are removed by etching only at the boundary of the well range 205 with the photo resist 209 as a mask, as shown in FIG. 8-7.

(Step 1-8)

After the photo resist 209 has been removed, the substrate is etched with the corrosion resistant film 208 as a mask (if no film 208 is fomed, the oxidation-resistant film 207 is used as a mask) to form a trench 210 on the substrate surface as shown in FIG. 8-8. This trench 210 is reverse trapezoidal in shape, in which the upper portion is wider in area than the lower portion. The etching method may be RIE or KOH solution. FIG. 8-8 shows the case where KOH solution method is adopted. In addition, it is also possible to readily form a trench as shown in accordance with an isotropic etching method by using other solution (e.g. nitric acid fluoride) or CDE. Further, the depth of this trench 210 will be described later in detail.

(Step 1-9)

Figures 8, 9, 10, 11:
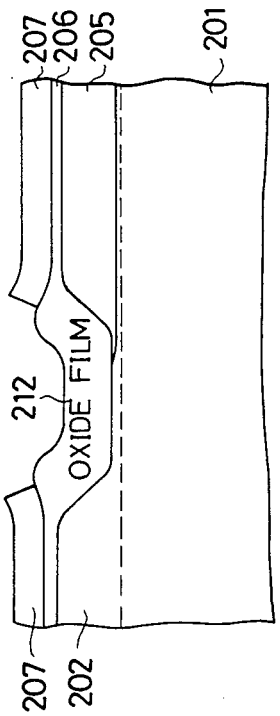

The corrosion resistant film 208 is removed according to the necessity as shown in FIG. 8-9. The reason why this corrosion resistant film 208 is removed is to reduce a stress generated by an upward force due to an extension of an oxide film formed in the trench 210 toward under the oxidation resistant film 207 (called bird beak (in shape) as depicted in FIG. 8-11). In other words, the thinner the film on a bird beak is, the smaller the stress will be applied.

(Step 1-10)

A thermal oxidation film 211 is once formed on the surface of the trench 210 where necessary as shown in FIG. 8-10, and then removed by etching. This is required when the shape of the trench 210 should be smoothened or when minute defects, which may be formed on the surface of the trench 10 during the trench forming process, should be removed. In many cases, it is preferable that a thermal oxidation film 211 is once formed and then removed by etching.

(Step 1-11)

The trench 210 is thermo-oxidized with the oxidation resistant film 207 as mask to form an oxide film 212 on the surface of the trench 210. The thickness of this oxide film 212 is such a value that the depth of the formed oxide film 212 from the substrate surface is enough to prevent latch-up phenomenon. The desired thickness of the oxide film 212 will be described in more detail later, because it depends upon the final epitaxial thickness, the etching depth of the trench 210, the width of the trench, the shape of the trench, etc.

(Step 1-12)

In case there exists a great difference in surface level of the oxide film 212, this level difference should be buried by the well-known etch back process. In more detail, a filler material 213 is buried in the level difference portion of the oxide film 212. If this filler material 213 is conductive, an insulating film 214 is formed on the surface thereof. As the filler material 213, $SiO_2$ or polysilicon is used being formed by CVP or sputtering method, as shown in FIG. 8-12.

(Step 1-13)

The oxidation resistant film 207 is completely removed as shown in FIG. 8-13. Further, the oxide film 206 is also removed where necessary; that is, according to the necessity of processes of forming some element separating thermal oxidation films (field insulating films).

(Step 1-14)

After a field insulating film 215 has been formed, a P-channel MOS transistor 216 is formed on the surface of the N-type epitaxial layer 202 and an N-channel MOS transistor 217 is formed on the surface of the P-type well range 205, respectively, in accordance with the well-known technique. Further, an insulating film 218 is formed thereon, and a wire 219 is formed by opening a contact hole for an electrode in this insulating film 218. Thereafter, the entire surface is covered by a protection insulation film 220, as shown in FIG. 8-14, to manufacture a complementary semiconductor device made up of a P-channel MOS transistor and an N-channel MOS transistor.

EMBODIMENT II

In this embodiment, the sequence of the manufacturing processes of the first embodiment is modified so as to form the well as follows:

(Step 2-1)

The same as the step 1-1.

(Step 2-2)

The same as the steps 1-5 to 1-12.

(Step 2-3)

The oxidation resistance film 207 is removed.

(Step 2-4)

The same as the steps 1-2 to 1-4, in which the well 205 is formed.

(Step 2-5)

The same as the step 1-14.

EMBODIMENT III

In this embodiment, the field insulating film 205 is formed together with the oxide film 212 formed on the surface of the trench 210.

(Step 3-1)

The same as the steps 1-1 to 1-10.

(Step 3-2)

The oxidation resistant film 207 on the element range is covered by a photo resist 221 to remove other portions by etching, as shown in FIG. 9.

(Step 3-3)

The oxide film 212 and the insulation film 214 are formed by thermal oxidization with the oxidation resistant film 207 as mask to obtain the device the same as shown in FIG. 8-14.

In this embodiment, although the processes from 3-1 to 3-3 are relatively simple, since the process 3-2 is required after the formation of the trench 210, there exist problems such that thickness of the applied resist film is not uniform due to the presence of the trench when the film is spin-coated or that the thickness of the insulation film 214 becomes too thick when a sufficient thickness of the oxide film 212 has been obtained; as a result, it is impossible to reduce the space between elements.

EMBODIMENT IV (Step 4-1)

The same as the steps 1-1 to 1-12.

(Step 4-2)

The oxidation resistant film 207 is left on the element range, and the other portions are removed by etching, as shown in FIG. 10.

(Step 4-3)

The field insulation film 215 is formed with the oxidation resistant film 207 as mask to obtain the device the same as shown in FIG. 8-14.

Further, the steps from 3-1 to 3-3 and 4-1 to 4-3 can be modified, as in the case of the steps 2-1 to 2-5, so as to previously form the well range.

Further, as other modified embodiments, it is possible to previously form a film having a high selectivity relative to the oxidation resistant film 207 (polycrystal silicon when the film 027 is SiN) under the oxidation resistant film 207. This film serves to prevent the damage caused when etching advances to the substrate surface by RIE in patterning the oxidation resistant film 207 during the process 1-7 or 3-2.

EMBODIMENT V

This embodiment can reduce the extension of the bird beak generated in the oxide film 212.

(Step 5-1)

The same as steps 1-1 to 1-9.

(Step 5-2)

The oxidation resistant film 231 is formed on the surface as shown in FIG. 11-1.

(Step 5-3)

The oxidation resistant film 231 is left only on the side wall of the trench 210 by anisotropic etching (e.g. RIE), and the film 231 is removed by etching as shown in FIG. 11-2.

(Step 5-4)

The same as the step 1-10.

(Step 5-5)

The oxide film 212 is formed on the trench 210 with the oxidation resistant films 207 and 231 as masks as shown in FIG. 11-3.

(Step 5-6)

The oxidation resistant film 231 is removed as shown in FIG. 11-4.

(Step 5-7) 35 The same as the steps from 1-12 to 1-14.

In the above embodiments, a single conductive type well range (single well) is formed in the epitaxial layer. However, without being limited to this, the present invention is applicable to the case where the substrate is a bulk wafer (the ordinary wafer) or where the well range is of twin type, the description of the processes of those cases being omitted herein. In general, it has been well known that the latch-up proof resistance is higher in the epitaxial substrate than in the bulk substrate, and higher in the twin well type than in the single well type. However, the substrate and the well structure should be selected under the consideration of the design standard of elements to be manufactured, ambience to be used, economical standpoint, etc. in combination. If the distance between the n+ diffusion range corresponding to the source or drain range of an N-channel MOS transistor and the P+ diffusion range corresponding to the source or drain range of a P-channel MOS transistor (referred to as N+-P+ distance) is 6 μm in the device to be manufactured, although the latch-up free condition is not realized as long as a bulk substrate is used, it is possible to markedly improve the latch-up proof resistance on the basis of the above-mentioned well separation method to a satisfactory degree.

Further, in order to prevent the impurity atom concentration from being lowered under the oxide film 212 (because substrate impurities are segregated due to the growth of the oxide film 212), it is also possible to add other processes such that impurities are ion-implanted onto the surface of the trench 210 with the corrosion resistant film 208 or the oxidation resistant film 207 as mask after the trench 210 has been formed in the process 1-8. However, since these additional processes can readily be understood, the detailed description thereof being omitted herein.

The depth of the trench 210 and the thickness of the oxide film 212 so formed as to be buried within the trench 210 will be described in further detail hereinbelow. The demands for the depth and the thickness are such as to provide a higher latch-up proof resistance, to generate no defects, to be within a dimension limit based upon lithographic technique, to be flat if possible, etc.

Figures 8, 9, 10, 11, 12:
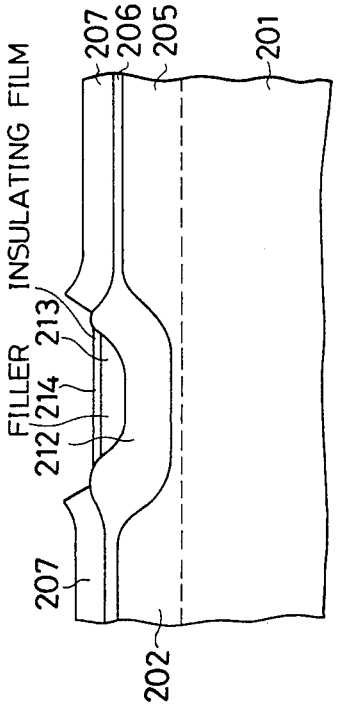
Figures 8, 9:
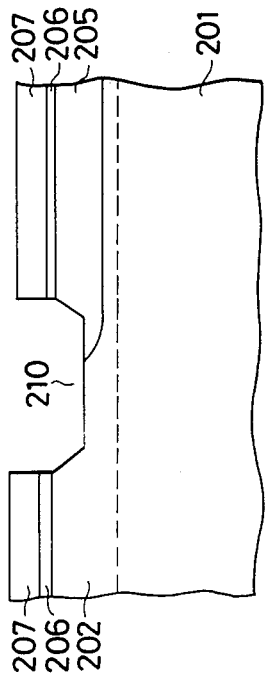
Figures 8, 9, 10:
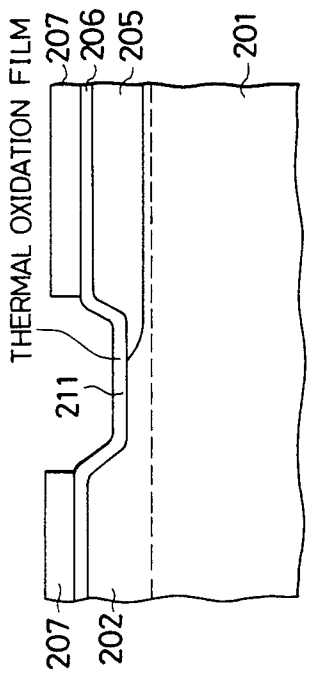
Figure 9:
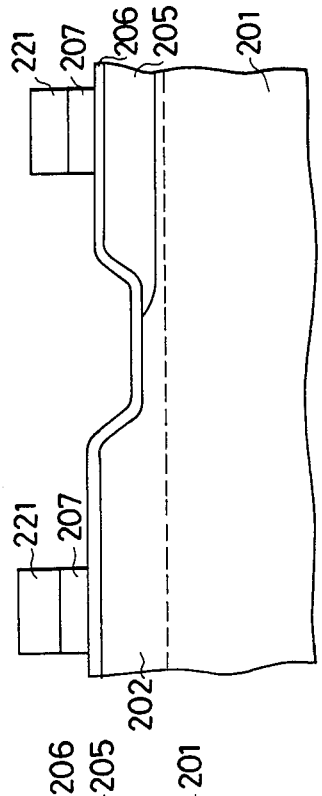
Figure 10:
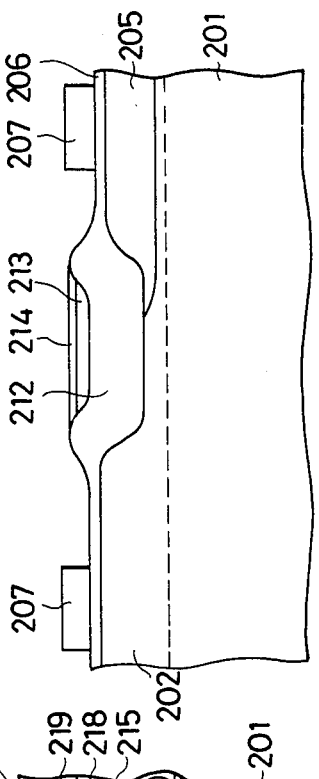

FIG. 12 (A) shows the relationship between the final epitaxial thickness T (um) and the depth t (um) of the bottom of the oxide film 212 from the substrate surface under the condition that the latch-up holding voltage VH is higher than 5 V when an N-type epitaxial layer is grown on an N-type substrate of about 0.02 ohm-cm resistivity with antimory as dopant. The solid curve (a) indicates that VH is 5 V when the distance between the N-channel MOS transister and the P-channel transistor is about 6 μm. The shaded range (I) indicates that VH is higher than 5 V; the non-shaded range (II) indicates that VH is lower than 5 V. If the supply voltage is 5 V and the latch-up holding voltage VH is higher than 5 V, since the latch-up will not be held, it has been well known that the element is free from latch up. Therefore, where the element is used under an ambience susceptible to noise current which readily causes the latch-up, it is necessary to set the thickness of the oxide film 12 within the range (I). Further, in the graph, the dashed line (b) indicates VH=5 V when the distance between the N-channel MOS transistor and the P-channel MOS transistor is 3 $\mu$m; the dashed line (c) indicates VH=5 V when the distance is 17 $\mu$m.

FIG. 12 (B) shows the similar relationship obtained when a P-type epitaxial layer is grown on a P-type substrate having a resistivity of about 0.02 ohm.cm with boron as dopant. Since baron is greater than antimony in diffusion coefficient, the time during which the impurity atom concentration under the final P-type epitaxial layer becomes the same as that at the sufficiently deep position of the substrate is relatively long, the substrate resistance is substantially higher than that obtained when an antimony substrate is used. However, both the graphs shown in FIGS. 12 (A) and 12 (B) indicate the case where the well range is formed by thermal diffusion. Therefore, in the case where impurities are injected into the well range on the basis of high energy ion implantation without being dependent upon thermal diffusion, the above-mentioned conditions can be modified; that is, it is possible to reduce the thickness of the oxide film 212 in the element having the same distnace between the N-channel MOS transistor and the P-channel MOS transistor. For instance, in the example of FIG. 12 (B) in which boron is dopant, although the depth of the oxide film 212 should be 2.5 $\mu$m when the well is formed by thermal diffusion, the depth is 1 $\mu$m when the well is formed by ion implantation.

An approximation formula which expresses the dependence of the final epitaxial thickness T and the minimuim (N+ - P+) distance S upon the depth t of the oxide film 212 can be obtained as follows:

If the seepage of impurities from the high impurity atom concentraiton substrate is less than 2 $\mu$m, as when an N-type epitaxial layer formed on the N-type substrate is used as an original substrate or when a P-type epitaxial layer formed on a P-type substrate having an N-type well range formed by high energy ion implantation is used as an original substrate, the relationship shown in FIG. 12 (a) can approximately be expressed as follows:

$$t \geq 1.5 T^2/S(\mu m) \qquad 1$$

Here, t more than 2 $\mu$m is not practical from the productivity standpoint. Since S is 12 $\mu$m in elements of the 4 $\mu$m design standard, S should be less than 12 $\mu$m. Therefore, if the seepage is less than 2 $\mu$m, the final epitaxial thickness should be less than 4 $\mu$m. Therefore, if the above formula 1 is not satisfied within this range, it is impossible to realize the latch-up free condition.

If the seepage is more than 2 $\mu$m but less than 6 $\mu$m, as when an N-type well range is formed in the epitaxial layer by high energy ion implantation with a P-type epitaxial layer formed on a P-type substrate as an original substrate, the relationship between t, T and S is shown in FIG. 12 (B), and can approximately be expressed in the vicinity of T=2 $\mu$m as follows:

$$t \geq 2.5 \times 1.5 T^2/S(\mu m) \qquad 2$$

The constant of 2.5 on the right side of the formula 2 becomes a value a little smaller than 2.5 in the vicinity of T=1 $\mu$m. In any cases, it is possible to realize VH>5 V if t=2 $\mu$m or less. further, when the supply voltage is 5 V or lower, since the minimum value of t shifts to a thicker value, the element is practically available as long as the element is allowed to be free from the latch up at 5 V.

On the other hand, the depth of the trench 210 formed at the process 1-8 shown in FIG. 8-8 becomes a function of the quantity of oxygen used for forming the oxide film 212 at the process 1-11 shown in FIG. 8-11.

Further, it has been known that the amount of encroach of the thermal oxidized film 212 toward the substrate is about 40% of the thickness of the thermal oxidation film when a trench with a width of 1.5 $\mu$m or more is thermal oxidized. Here, if the depth of the trench 210 is designated as y, and the thickness of the thermal oxidation film 212 is designated as x, the depth t from the substrate surface to be bottom of the oxide film 212 can be given by the following formula:

$$t = 0.4 \times + y \qquad 3$$

This value t should satisfy the condition shown in FIG. 12 (B). Here, where the width of the trench 210 is less than 1.5 $\mu$m, since the amount of encroach of the oxide film 212 toward the substrate is decreased to about 35%, the coefficient of the second term on the right side of the formula 3 is 0.35.

Figures 8, 9, 10, 11, 12, 13:
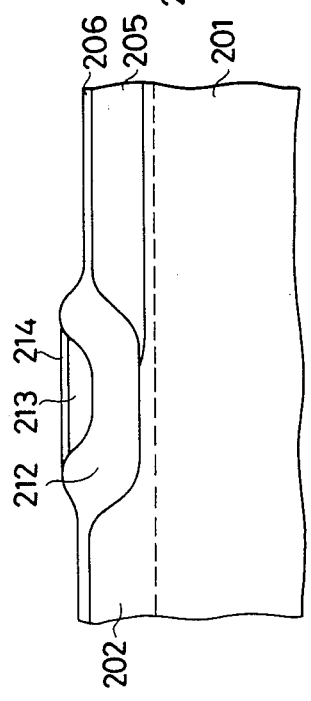
Figures 8, 9, 10, 11, 12, 13, 14:
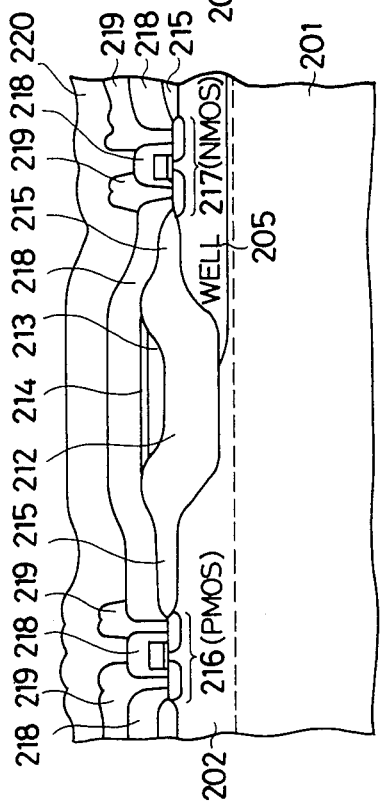
Figures 1, 11:
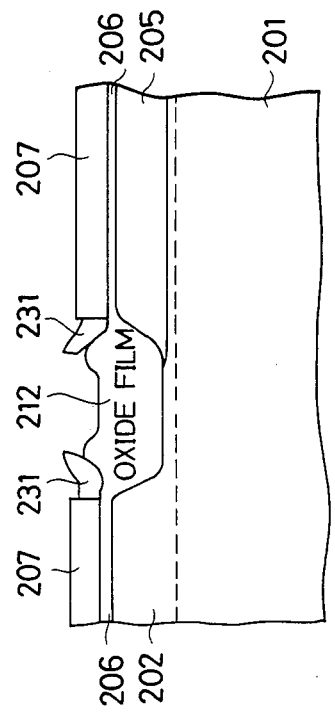
Figures 3, 11:
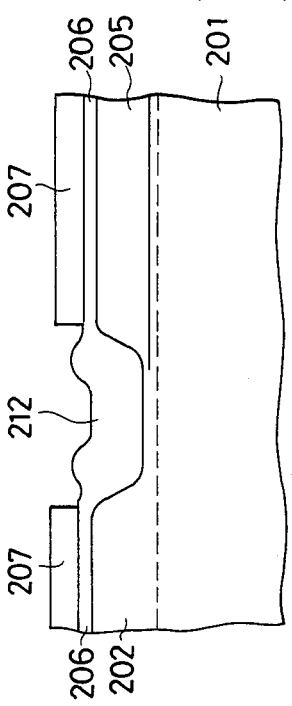
Figures 2, 11:
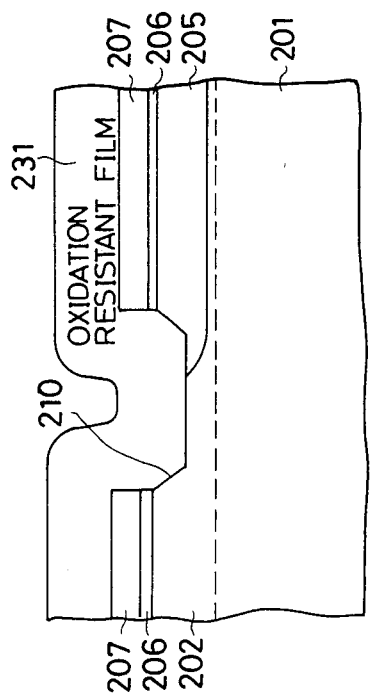
Figures 4, 11:
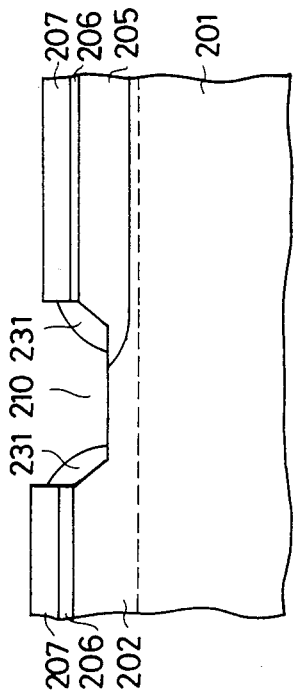

Further, the depth of the trench 210 and the thickness of the oxide film 212 are related to the easiness of crystal defect occurrence toward the substrate. For instance, the assumption is made that a trench 210 having an almost vertical side wall as shown in FIG. 13 (A) is formed by RIE and thereafter an oxide film 212 is formed thereon as shown in FIG. 13 (B). Here, it has been known that the angle $\theta$ shown in FIG. 13 (B) is related to the occurrence of defects; that is, it is possible to prevent detects from being produced by reducing the angle $\theta$ below 70 degrees (Whose $\theta$ denotes the maximum inclination). If the depth of the trench 210 shown in FIG. 13 (A) is too deep, the value $\theta$ cannot be controlled to an optimum value. However, where a trench 210 having tapered side walls as shown in FIG. 8-9 is formed by wet etching technique and a silicon substrate having a (100) surface is etched by a KOH solution, the taper angle is about 45 degrees. Therefore, the angle $\theta$ shown in FIG. 13 (B) is not the condition where defects are produced, even if the trench 210 is formed deep. As described above, optimum values of x and y should be selected on the basis of the cross-sectional shape of the trench 210. Further, FIG. 14 shows a curve of the dependence of $\theta$ upon the defect density, which indicates that $\theta$ should be less than 70 degrees.

Figure 13A:
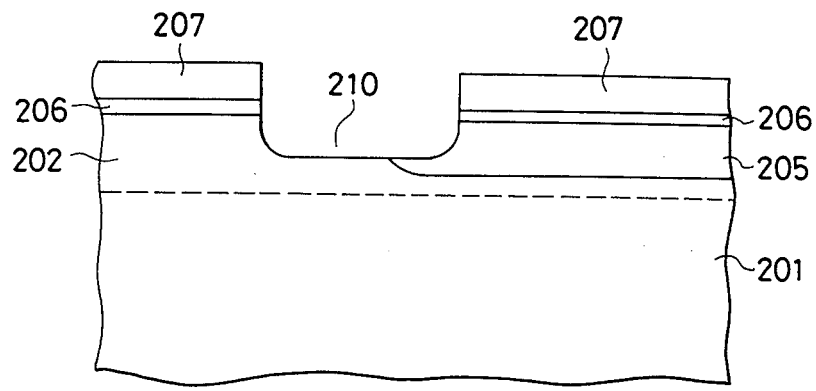
Figure 13B:
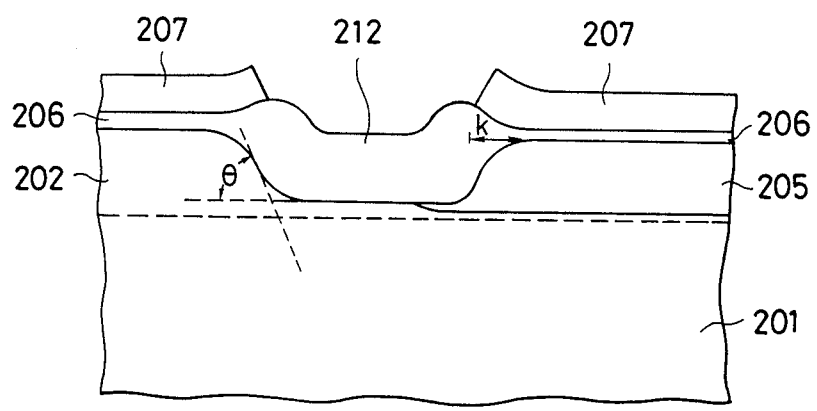
Figure 15:
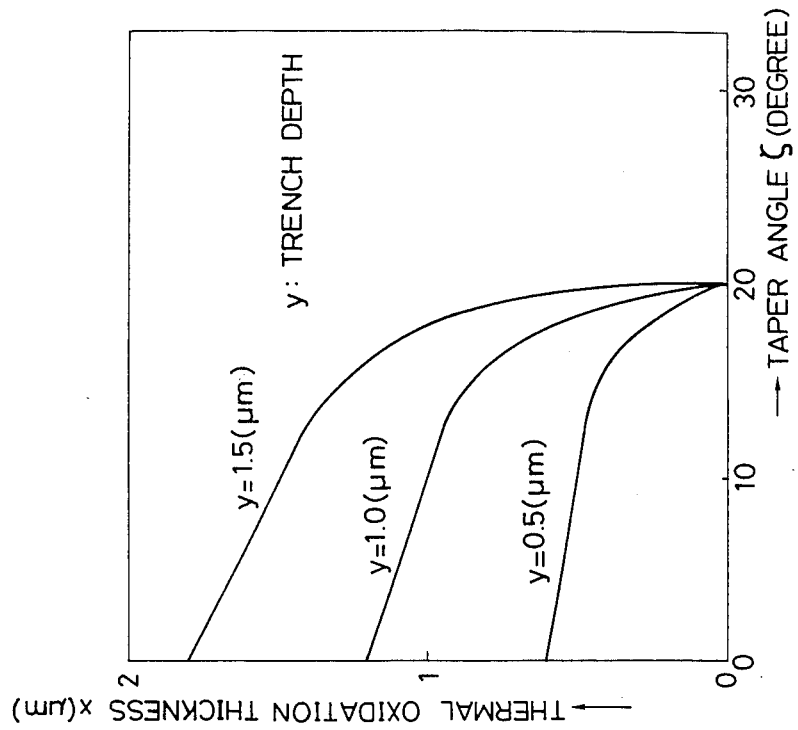
Figure 14:
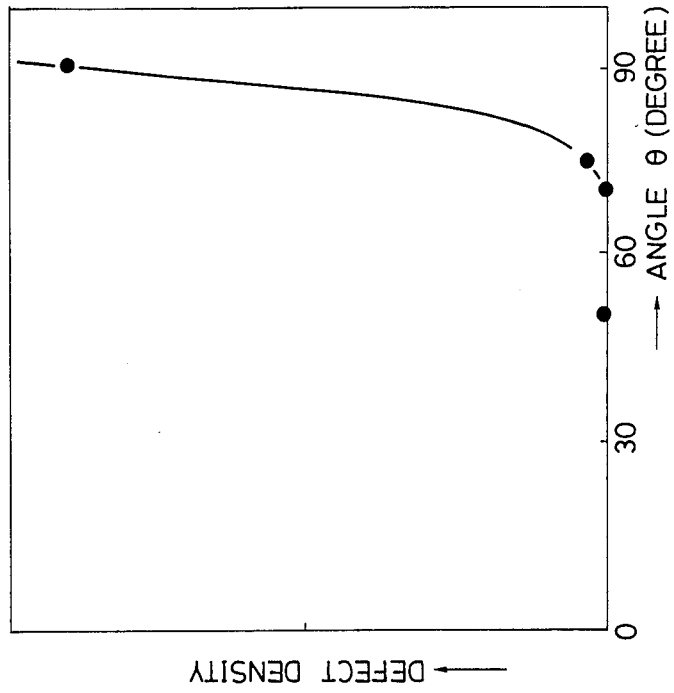
Figure 16A:
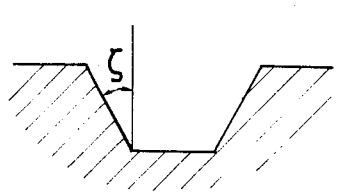
FIGS. 16 (A) and 16 (B) are cross-sectional views of a trench for assistance in explaining in present invention, and FIGS. 17 (A) and 17 (B) are graphical representations showing the relationship between the thermal oxidation film thickness and the trench depth for assistance in explaining the present invention.
Figure 16B:
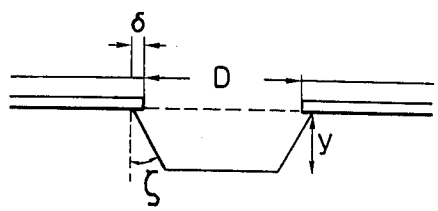

FIG. 15 shows simulation results of dependence of etching taper angle $\zeta$ shown in FIG. 16 (A) upon the oxide film thickness X which reduces $\theta$ below 70 degrees. The parameter Y in FIG. 15 is an etching depth. If $\zeta$>20 degrees, O is always below 70 degrees. If $\zeta$<20 degrees, the smaller the etching depth y is, the smaller value of x will be allowable. This is because if the distance (N+-P+) is sufficiently large, $\theta$ becomes a bird beak value (about 20 degrees) in principle as far as oxidation is enough irrespective of $\zeta$ in the case of a shallow depth y. However, if the distance N+-P+ is short, since the extension of the bird beak restricts the maximum value of x, this case is disadvantageous when etching taper angle $\zeta$ is small and the depth Y of the trench 210 is great. The extension of the bird beak, that is, the length k (shown in FIG. 13B) from the edge of the oxidation resistant film 207 of SiN to the top end of the bird beak can be approximated by the following formula:

$$K = 1.3X \qquad 4$$

Further, the minimum value S of the distance (N+-P+) can be expressed as:

$$S = 2k + D + 2\sigma \qquad 5$$

Where D denotes a space of the oxidation resistant film 207, $\sigma$ denotes a fitting accuracy between the N+, P+ diffusion range and trench pattern. As depicted in FIG. 16 (B), if the trench 210 is tapered, D should be $$D \geq 2Y \tan \zeta + 2\delta \qquad 6$$

Where $\delta$ denotes an etching difference. Therefore, the formula 5 can be rewritten as $$S \geq 2X + 2y \tan \zeta + 2\delta + 2\sigma \qquad 7$$

On the other hand, the minimum value of D can be determined by the limit of lithographic technique. In the present situation, the minimum space is 0.8 $\mu$m from the productivity standpoint and therefore the following formula can be established:

$$D = S - 2.6X - 2\delta - \sigma \geq 0.8 \qquad 8$$

Further, there exists the surface flatness which determines the values x and y, and it is preferable that the surface is not concave. Further, the swelling of the oxide film 712 from the substrate is considered as 60% of the film thickness, if $$y < 0.6X \qquad 9$$

the trench 10 isfilled with the oxide film.

The above description can be summarized as follows:
(1) $0.4X + y \geq t$ (determined on the basis of FIG. 12A).
(2) $S \geq 2X + 2y \tan \zeta + 2\delta + 2\sigma$ by x, y, $\zeta$ determined on the basis of FIG. 15.
(3) $S - 2.6X - 2\delta - 2\sigma \geq 0.8$
(4) $y < 0.6X$ The some practical values x and y will be described by way of example.

(EXAMPLE 1)

An N-type epitaxial layer is formed on an N type substrate with antimony as dopant. The final epitaxial thickness is 2 $\mu$m, and the (N+-P+) distance is 5 $\mu$m. The etching depth and the exidation amount will be obtained under the condition that VH is higher than 5 V. When a KOH solution is an etchant, $\zeta$ is 36 degress, and $\delta$ is 0.1 $\mu$m. Here $\sigma$ is assumed to be 0.5 $\mu$m as a practical value. Since required value t is more than 1.1 $\mu$m on the basis of the relationship shown in FIG. 12 (A), the following formula can be obtained from the formula 3 as follows:

$$0.4X + y \geq 1.1 \qquad 10$$

Since any x and y can be allowed in FIG. 15, the condition (2) is $$2.6X + 1.45Y \leq 3.8 \qquad 11$$

The condition (3) determined by the minimum lithographic dimension is $$x \leq 1.15 \qquad 12$$

The flatness condition (4) is $$y > 0.6x \qquad 13$$

Figure 17A:
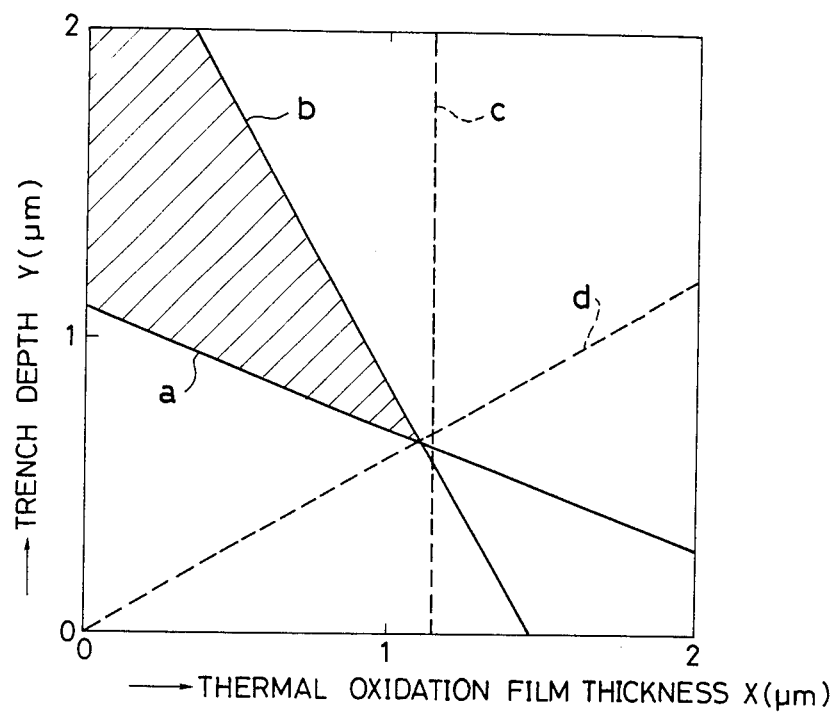
Figure 17B:
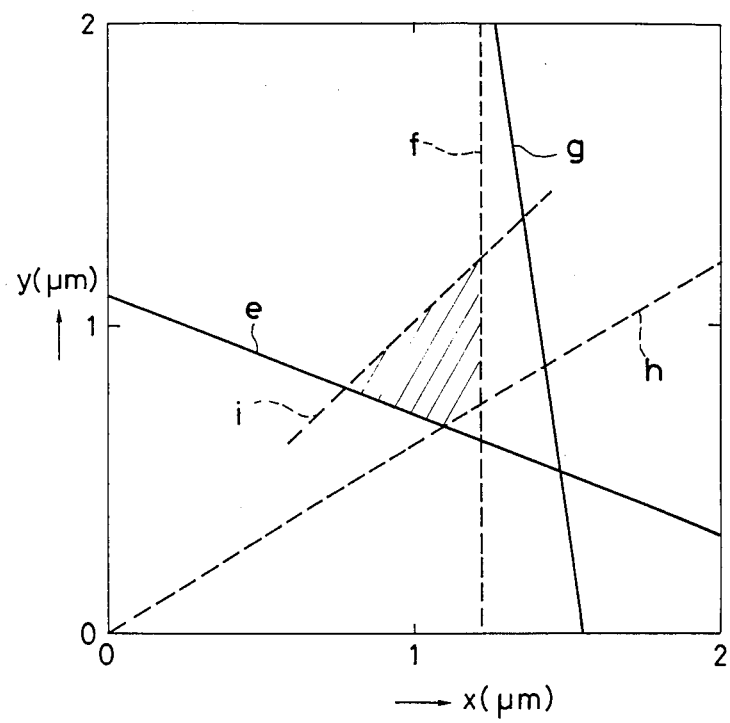

An allowable range of x or y determined by the formulas 10 to 13 is shown by shaded portion in FIG. 17 (A). Further, the straight lines a to d shown in FIG. 17 (A) indicate the boundaries determined by the formulas 10 to 13, respectively. That is, the desired conditions are: the etching depth y is 0.66 $\mu$m and the film thickness x of the oxide film 212 formed thereon is 1.1 $\mu$m as its standard.

(EXAMPLE 2)

A trench 210 having a taper $\zeta = 10$ degrees is formed on the substrate the same as in Example 1. $\delta$ is determined to be 0 $\mu$m. The condition (1) is the same as in Example 1. The condition (2) depends upon x and y as follow, if $\zeta = 10$ degrees in FIG. 15:

$$2.6X + 0.35y \leq 4 \qquad 14$$

The condition (3) is $$x \leq 1.23 \qquad 15$$

The same results as shown in FIG. 17 (B) have been obtained in the same way as in FIG. 17 (A). The straight lines e to h shown in FIG. 17 (B) indicate the boundaries of the formulas 11, 15, 14, and 13, respectively. The straight line i corresponds to the relationship shown in FIG. 15. FIG. 17 (B) indicates that if the taper angle is small, the allowable range (shaded portion) within which the accurrence of defects can be suppressed becomes narrow.

When seen from the flatness standpoint, since the tapered angle is large in Example 1, it is disadvantageously difficult to increase the film thickness x on the basis of the restriction of the (N+-P+) distance. However, this problem can readily be solved by forming the S D G (source, drains, gate) ranges and the oxide film 12 in self-matching fashion by the process 3-1 or 3-3 to set $\sigma$ to zero, by reducing the bird peak length k in the process 5-1 or 5-7 or the like, or by burying the stepped portion in the process 1-12.

What is claimed is:
1. A CMOS semiconductor device, comprising
 (a) a first conductive-type semiconductor substrate including a high impurity atom concentration first layer and a low impurity atom concentration second layer formed on said first layer with a thickness thinner than that of said first layer;
 (b) a second conductive-type MOS transistor formed in a first region of said low impurity atom concentration second layer;
 (c) a second conductive-type well range formed in a second region of said low impurity atom concentration second layer;
 (d) a first conductive-type MOS transitor formed within said second conductive-type well range; and
 (e) a trench formed in the vicinity of a boundary between said first region in which said second conductive-type MOS transistor is formed and said second region in which said second conductive-type well range is formed, a depth of said trench being shallower than a thickness of said low impurity atom concentration second layer but deeper than a value obtained by subtracting 2 μm from the thickness of said low impurity atom concentration second layer, such that a portion of said second layer separates the bottom of said trench from said first layer, an inner wall surface of said trench being formed with an oxide film, and said trench being filled with a substance.

2. The CMOS semiconductor device as set forth in claim 1, wherein the depth of said trench is shallower than 3 μm.

3. A CMOS semiconductor device as set forth in claim 1 wherein an angle subtended by a boundary between said oxide film and the substrate and the substrate surface in a cross section of said trench is below 70° at a position where said thermal oxidation film encroaches on said substrate.

4. A CMOS semiconductor device as set forth in claim 1 wherein an angle subtended by a major side surface of said trench and the substrate surface in a cross section of said trench is below 70°.

5. A CMOS semiconductor device as set forth in claim 1 wherein the formula $t \geq 1.5T^2/S$ (μm) is satisfied, where t denotes a depth of the bottom of said oxide film formed on the inner surface of said trench from said substrate surface, T denotes a seepage distance of impurities from said high impurity atom concentration first layer, and S denotes a minimum distance between said first conductive-type MOS transistor and said second conductive-type MOS transistor.

6. A CMOS semiconductor device as set forth in claim 1 wherein said low impurity atom concentraction second layer is an epitaxial layer.

7. A CMOS semiconductor device as set forth in claim 1 wherein said substance that fills said trench has a coefficient of expansion approximately equal to the coeficient of expansion of said low impurity concentration second layer.

8. A CMOS semiconductor device as set forth in claim 1 wherein said substance that fills said trench is a semiconductor material.

9. A CMOS semiconductor device, comprising:
(a) a first conductive-type semiconductor substrate including a high impurity atom concentration first layer and a 2 to 4 μm thick low impurity atom concentration second layer formed on said first layer;
(b) a second conductive-type MOS transistor formed in a first region of said low impurity atom concentration second layer;
(c) a second conductive-type well range formed in a second region part of said low impurity atom concentration second layer;
(d) a first conductive-type MOS transistor formed within said second conductive-type well range; and
(e) a 2 to 3 μm deep trench formed in the vicinity of a boundary between said first region in which said second conductive-type MOS transistor is formed and said second region in which said second conductive-type well range is formed, the depth of said trench being shallower than a thickness of said low impurity atom concentration second layer, such that a portion of said second layer separates the bottom of said trench from said first layer, an inner wall surface of said trench being formed with an oxide film, and said trench being filled with a semiconductor substance.

10. A CMOS semiconductor device as set forth in claim 9 wherein an angle subtended by a boundary between said oxide film and the substrate and the substrate surface in a cross section of said trench is below 70° at a position where said thermal oxidation film encroaches on said substrate.

11. A CMOS semiconductor device as set forth in claim 9 wherein an angle subtended by a major side surface of said trench and the substrate surface in a cross section of said trench is below 70°.

12. A CMOS semiconductor device as set forth in claim 9 wherein the formula $t\ 1.5\ T^2/S$ (μm) is satisfied, where t denotes a depth of the bottom of said oxide film formed on the inner surface of said trench from said substrate surface, T denotes a seepage distance of impurities from said high impurity atom concentration first layer, and S denotes a minimum distance between said first conductive-type MOS transistor and said second conductive-type MOS transistor.

13. A CMOS semiconductor device as set forth in claim 9 wherein said low impurity atom concentration second layer is an epitaxial layer.

* * * * *